United States Patent
De Jong et al.

(10) Patent No.: US 6,807,505 B2
(45) Date of Patent: Oct. 19, 2004

(54) CIRCUIT WITH INTERCONNECT TEST UNIT

(75) Inventors: Franciscus G. M. De Jong, Eindhoven (NL); Mathias N. M. Muris, Eindhoven (NL); Robertus M. W. Raaijmakers, Eindhoven (NL); Guillaume E. A. Lousberg, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/621,002

(22) Filed: Jul. 16, 2003

(65) Prior Publication Data

US 2004/0059535 A1 Mar. 25, 2004

Related U.S. Application Data

(62) Division of application No. 09/402,154, filed as application No. PCT/IB99/00172 on Jan. 29, 1999, now Pat. No. 6,622,108.

(30) Foreign Application Priority Data

| Feb. 22, 1998 | (EP) | ............................................. 98200288 |
| May 6, 1998 | (EP) | ............................................. 98201482 |
| Nov. 30, 1998 | (EP) | ............................................. 98204042 |

(51) Int. Cl.⁷ ............................................. G01R 31/28
(52) U.S. Cl. ....................................... 702/118; 324/500
(58) Field of Search ............................. 702/57–59, 108, 702/117, 118; 324/500, 512, 527; 326/16, 106; 714/25, 27, 30, 718, 719, 726, 727, 733

(56) References Cited

U.S. PATENT DOCUMENTS

| 5,103,450 A | * | 4/1992 | Whetsel ....................... 714/724 |
| 5,416,409 A | * | 5/1995 | Hunter ...................... 324/158.1 |
| 5,781,559 A | * | 7/1998 | Muris et al. ................. 714/726 |

FOREIGN PATENT DOCUMENTS

| EP | 0588507a2 | * | 3/1994 | ........... G01R/31/04 |
| GB | 2278689 A | * | 12/1994 | ........... G01R/31/28 |

* cited by examiner

Primary Examiner—Marc S. Hoff
Assistant Examiner—Craig Steven Miller

(57) ABSTRACT

An electronic circuit comprises a plurality of input/output (I/O) nodes for connecting the electronic circuit to a further electronic circuit via interconnects. A main unit implements a normal mode function of the electronic circuit. A test unit tests the interconnects. The electronic circuit has a normal mode in which the I/O nodes are logically connected to the main unit and a test mode in which the I/O nodes are logically connected to the test unit. In the test mode the test unit is operable as a low complexity memory via the I/O nodes.

9 Claims, 3 Drawing Sheets

CIRCUIT WITH INTERCONNECT TEST UNIT

Figure 1:
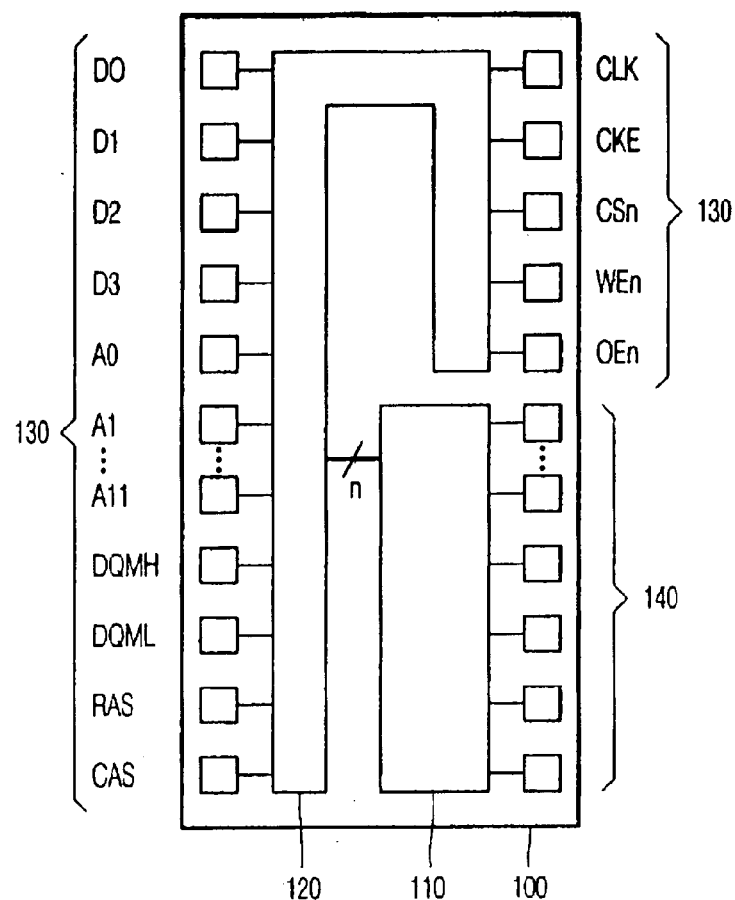

This application is a divisional of Ser. No. 09/402,154 filed Sep. 29, 1999 now U.S. Pat. No. 6,622,108 which is a 371 of PCT/IB99/00172 filed Jan. 29, 1999.

The invention relates to an electronic circuit comprising: a plurality of input/output (I/O) nodes for connecting the electronic circuit to a further electronic circuit via interconnects, a main unit for implementing a normal mode function of the electronic circuit, and a test unit for testing the interconnects, the electronic circuit having a normal mode in which the I/O nodes are logically connected to the main unit and a test mode in which the I/O nodes are logically connected to the test unit.

The invention further relates to a method of testing interconnects between a first electronic circuit and a second electronic circuit, the first electronic circuit comprising a main unit implementing a normal mode function of the first electronic circuit, and a test unit for testing the interconnects, the method comprising the steps of logically connecting the test unit to the interconnects, and putting test data on the interconnects by the second electronic circuit.

Such a circuit is known from "Boundary-scan test, a practical approach", H. Bleeker, P. van den Eijnden and F. de Jong, Kluwer, Boston, 1993, ISBN 0-7923-9296-5, FIGS. 1–19, which shows an integrated (IC) in accordance with the boundary-scan test standard IEEE Std. 1149.1. The known circuit has a main unit or core logic that is responsible for providing some arbitrary specified function in a normal mode of the circuit. The known circuit further has a test unit for in a test mode performing an interconnect test, i.e. a test whether the circuit is properly connected to a further circuit via its I/O nodes or IC pins. Efficient interconnect test of miniaturised and/or complex circuit assemblies is a necessary part of the production process of such assemblies. The boundary-scan test technique is accepted as standardised solution for interconnect test. It is available in most of the leading microprocessor families and is supported for in-house developed application specific ICs through automated tools in the IC design process.

The test unit of the known boundary-scan circuit includes a test control unit or Test Access Port controller and a shift register or boundary-scan register along the circuit boundary, cells of the shift register being connected to I/O nodes corresponding to the interconnects to be tested. The test control unit has a state machine controlling states of the shift register, examples of such states being a shift state for shifting in/out data into the shift register and a capture state for capturing data originating from the interconnects into the shift register. The shift register is accessible from outside the circuit via a Test Data In (TDI) node and a Test Data Out (TDO) node. A Test Clock signal (TCK) and a Test Mode Select signal (TMS) are provided from outside the circuit to the test control unit for stepping through the various states. In the normal mode of the known circuit, the I/O nodes are logically connected to the main unit, thereby allowing the circuit to perform its normal mode function. In the test mode of the known circuit, the I/O nodes are logically connected to the test unit, thereby giving the test unit access to the interconnects.

Provided that also the further circuit is equipped with a test unit in accordance with the boundary-scan test standard, the interconnects between the two circuits can be tested according to the standard boundary-scan test method. Hereto, appropriate test data is first shifted into the shift registers of the two circuits and is subsequently applied to the interconnects. Then, response data originating from the interconnects is captured into the shift registers and subsequently shifted out of the shift registers for observation. From the response data it can be determined whether the circuits are properly interconnected. For a single interconnect this means that to one of its ends a signal is applied and at the other end it is observed whether that signal is transmitted. In this way, an open circuit in an interconnect can be found. Additionally, a number of test patterns will be applied to the interconnects in order to check for short-circuits between neighbouring interconnects, or between an interconnect and a power supply line. Essentially, interconnect testing comes down to applying test data to one end of an interconnect and observing response data at another end, in such a way that open circuits and short circuits are detected.

A problem with the boundary-scan approach is that for some circuits pin count and pin compatibility considerations inhibit the addition of extra pins to a circuit design for the TCK, TMS, TDI, TDO and the optional TRSTN signals. Moreover, the price-pressure in some semiconductor fields is such that it is considered to be too expensive to reserve area for interconnect test of the size as required by boundary-scan circuitry.

It is an object of the invention to provide a circuit as specified in the preamble, that allows interconnect testing with reduced overhead in terms of required I/O nodes and/or area. This object is achieved according to the invention in an electronic circuit, which is characterised in that in the test mode the test unit is operable as a low complexity memory via the I/O nodes. Low complexity memories are those memories that do not have to be put through a complex initialisation process before they can be accessed, and that have simple access protocols without dynamic restrictions. Such a test unit enables an alternative procedure for applying test data to one end of an interconnect and observing response data at the other end. If the low complexity memory has a read-only character and holds pre-stored test data at a number of addresses, the test unit produces this pre-stored test data at its side of the interconnects when address data and appropriate control data are applied to it by the further circuit via the interconnects. The further circuit then receives response data, which should be identical to the pre-stored test data. In this way, both the interconnects that are used to carry the address and control data and the interconnects that are used to carry the pre-stored data itself are tested. It is important that particular input data for the test unit, i.e. the address, result in output data from the test unit that are known a priori, i.e. the stored data. If the low complexity memory allows both read and write access, the further circuit can apply test data to its side of the interconnects in a write mode of the test unit, thereby storing the test data in the test unit. In a subsequent read mode of the test unit, the further circuit can read back response data.

Whether the test unit has a read-only or a read/write behaviour, it does not need a state machine like the boundary-scan state machine and can therefore be implemented consuming less area. Moreover, the simple operation of the test unit allows less pins or even no pins at all to be reserved for controlling the test unit in the test mode. For both a read-only and a read/write test unit, a subset of the interconnects is used as a data bus for exchanging the storage data. At least in the case that the test unit has a read/write behaviour, a further subset of the interconnects is used as a control bus, including, for example, control lines for controlling the read and/or write process. At least in the case that the test unit has a read-only behaviour, a still further subset of the interconnects is used as an address bus for selecting the storage location to read from. An important aspect of the invention is that one is free how to map the data bus, the control bus and/or the address bus on the interconnects to be tested.

Access to the control bus, the address bus, and the data bus during test mode could be provided, for example, via boundary-scan circuitry of the further circuit. Then, with ordinary boundary-scan test equipment, data can be shifted in and out of the further circuit. In this way, data to be supplied to the control bus and/or the address bus and data returned by the test unit on the data bus can be handled. As a further example, if the further circuit is a programmed microprocessor or Application-Specific IC (ASIC), the further circuit could perform the interconnect test in a stand alone fashion, without the need for external equipment for feeding the further circuit with the test data and for evaluating the response data. It is noted that the further circuit alternatively could consist of two or more separate circuits, together operating the test unit as a low complexity memory.

An embodiment of the electronic circuit according to the invention is defined in claim 2. A Read-Only Memory (ROM) is a suitable device for holding the data required by the interconnect test. When control data, in the form of an address and, if necessary, a limited number of further control signals, is applied to the circuit, the ROM outputs data pre-stored at that address on the data bus. It will be clear that in this way both the data bus, the address bus and, if present, the control bus are tested. A small number of test patterns pre-stored in the ROM would normally suffice for an interconnect test capable of detecting open circuits in interconnects and short circuits between interconnects. It will further be clear that for the test unit being operable as a low complexity memory, it is not required that the test unit is implemented as a real ROM table. Especially if only a small number of test patterns is used, the test unit could be implemented as a combinatorial circuit, leading to more efficient area usage.

An embodiment of the electronic circuit according to the invention is defined in claim 3. In relation with such a read/write register, the control bus at least controls whether the register is in a read mode or in a write mode, and the data bus is used for both supplying the data to be written to the test unit and for receiving the data to be read back from the test unit. In this embodiment, no address bus is needed since only a single register is used.

An embodiment of the electronic circuit according to the invention is defined in claim 5. The test circuit of this embodiment requires comparatively little area of the substrate on which it is manufactured. Furthermore, it enables to test the interconnects in a single type of test and with a very good test coverage, i.e. a small set of patterns suffices to detect the possible defects in the interconnects. Furthermore, the diagnostic resolution of the test is very good since almost all faults have a unique signature.

High complexity memory devices are those devices which have complex protocols for reading from and writing into their memory array. Therefore, as opposed to low complexity memories, high complexity memories are not suited as test units for interconnect testing, as the process of exchanging data is too complex and therefore takes too much time. Examples of high complexity memory devices are Synchronous Dynamic Random Access memories (SDRAMs) and non-volatile memory like flash memory devices. Besides complex access protocols, high complexity memories often need initialisation and have dynamic restrictions. The initialisation is troublesome for testing because (almost) all control lines and address lines have to be connected correctly to succeed in initialisation. Although interconnect problems with control and address lines can be detected because the failing initialisation will block all access to the devices, the diagnosis of the failure, i.e. exactly which of the pins is not connected correctly has a very low resolution.

The dynamic restrictions of SDRAMs, usually identified by the refresh time and the maximum RAS pulse width, hamper interconnect test because the test patterns (i.e. writing into and reading from the memory array) have to meet the dynamic requirements. The speed of application of test patterns using a boundary-scan circuit is determined by the length of the boundary-scan register and the maximum test clock frequency. The test clock frequency is determined either by the circuit implementation of the boundary-scan circuit in the ICs on the board or by the maximum speed of the boundary-scan tester.

For these reasons, high complexity memories form a class of circuits that could very well benefit from adding a low complexity memory for enabling efficient interconnect testing. This is especially true because boundary-scan is hardly available in memory devices due to pin count and/or pin compatibility considerations.

An embodiment of the circuit according to the invention is described in claim 6. This particular way of activating the test mode is possible because in most SDRAMs the first action to be performed after power up is prescribed to be a write action. Thus at power up, by utilising the read action for activating the test mode, the normal operation of the SDRAM is not effected. As an alternative, the circuit in accordance with the invention can be brought into test mode via a particular combination of input signals on the I/O nodes, or via a dedicated node that is dedicated to this function.

Non-volatile memories like flash memory devices hamper interconnect test, because writing into the memory array for test purposes is not allowed when the device is already pre-programmed. This test would destroy the functional data. An un-programmed device can be written into but has to be erased afterwards. Erasure of large memory blocks can take up to several seconds, lengthening considerably the board interconnect test.

By including a test unit in accordance with the invention, high complexity memories, including non-volatile memories, can undergo an efficient interconnect test. One could use the normal mode data bus, address bus and/or control bus for the test mode as well. To also test interconnects that provide signals that are specific for the high complexity memory functionality, and therefore are not needed to control the test unit in the test mode, either the data bus or the address bus can be extended with these interconnects. The invention enables interconnect testing using test patterns which take only milliseconds to execute and for which test pattern generators are commercially available.

Low complexity memory types like Static Random Access Memories (SRAMs) and (Programmable) ROMs can readily be tested for their connectivity using neighbouring circuits equipped with boundary-scan or neighbouring microprocessors and/or ASICs. For interconnect testing of such low complexity memories no extra measures in the form of added test units have to be taken.

It is a further object of the invention to provide a method as specified in the preamble, which performs the interconnect test with reduced overhead in terms of required I/O nodes and/or area. This object is achieved according to the invention in a method, which is characterised in that the putting step comprises operating the first electronic circuit as a low complexity memory by the second electronic circuit.

Although the invention is presented in the context of boundary-scan testing, which mainly applies to testing interconnects between ICs on a carrier, such as a printed circuit board (PCB), the principles of the invention are equally applicable to the testing of interconnects between any two circuits, such as interconnects between cores within a single IC or interconnects between ICs on distinct PCBs that are inserted into a cabinet.

Figure 2:
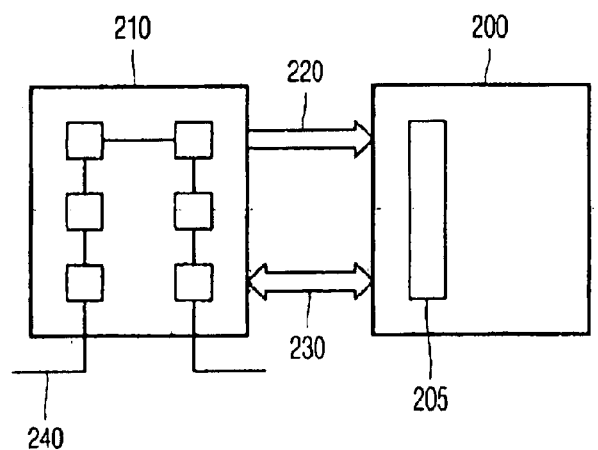
Figure 3:
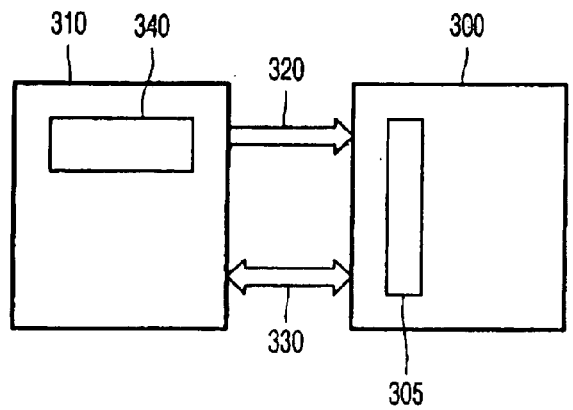
Figure 4:
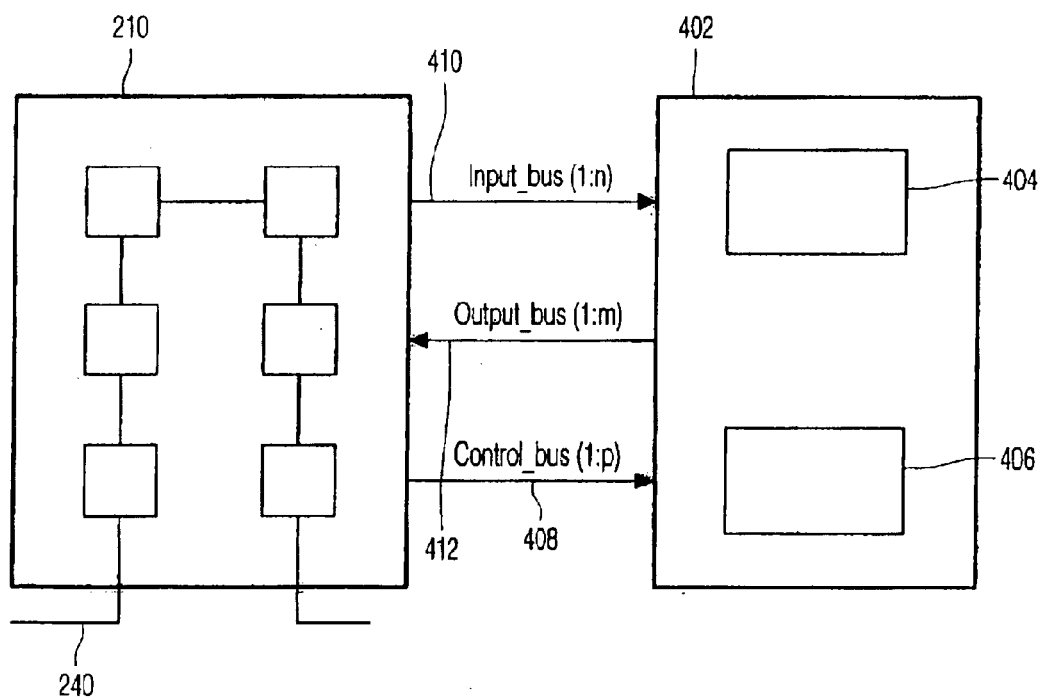
Figure 5:
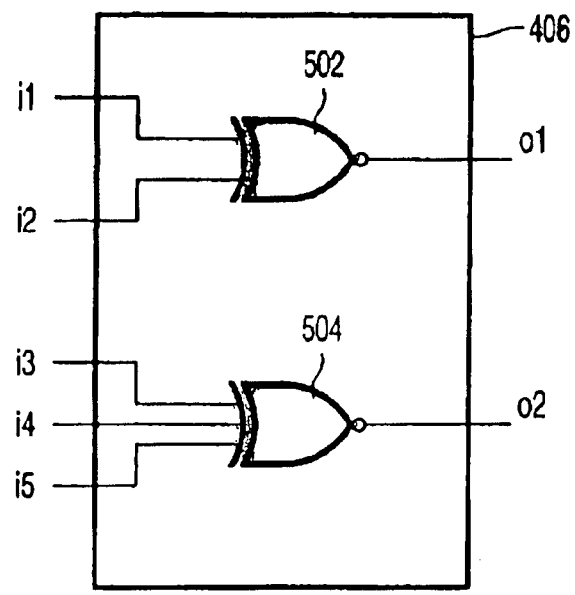
Figure 6:
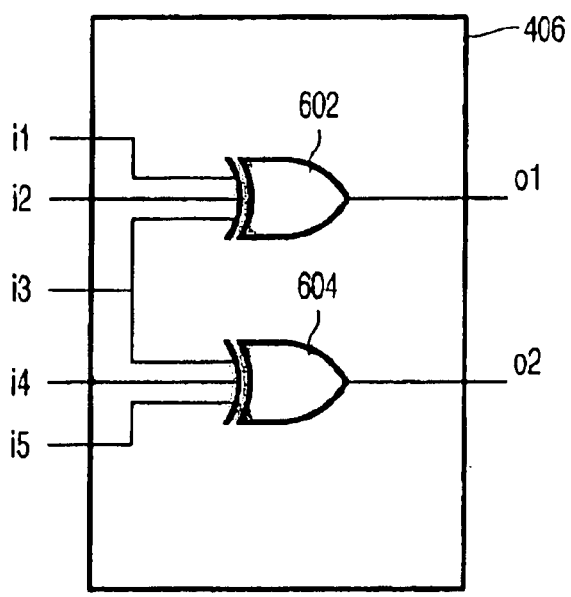

The invention and its attendant advantages will be further elucidated with the aid of exemplary embodiments and the accompanying schematic drawings, whereby:

FIG. 1 shows an embodiment of a circuit in accordance with the invention,

FIG. 2 shows a way to provide access during interconnect test to a circuit that is testable in accordance with the invention, FIG. 3 shows a further way to provide access during interconnect test to a circuit that is testable in accordance with the invention, FIG. 4 shows an alternative embodiment of the invention, FIG. 5 schematically shows the test unit for five inputs and two outputs, and FIG. 6 schematically shows an alternative for the test unit for five inputs and two outputs.

Corresponding features in the various Figures are denoted by the same reference symbols.

FIG. 1 shows an embodiment of a circuit 100 in accordance with the invention. The circuit 100 has I/O nodes 130, 140, through which the circuit 100 is connectable to external circuits. An I/O node may be an input node, i.e. a node only suitable to receive signals, an output node, i.e. a node only suitable to send signals, or a bi-directional node, i.e. a node suitable to either receive or send signals. For performing its intended normal mode function, the circuit 100 has a main unit 110, which is, by way of example, assumed to be an SDRAM. Thus, the circuit 100 is in fact an SDRAM device. It is further assumed that the circuit 100 is part of an assembly, whereas interconnects between the circuit 100 and further parts of the assembly should be testable. Hereto, the circuit 100 has a test unit 120, which is connected to the main unit 110 via n parallel connections and to the I/O nodes 130. In a normal mode of the circuit 100, the test unit 120 is transparent, and signals can pass freely between the I/O nodes 130 and the main unit 110. In a test mode of the circuit 100, the main unit 110 is logically disconnected from the I/O nodes 130 and the test unit 120 is in control. It is noted that preferably, but not necessarily, all I/O nodes are arranged for interconnect testing. To indicate this, the I/O nodes 140 are not connected to the test unit 120, and therefore, the test unit 120 does not offer testability for interconnects corresponding to these I/O nodes 140.

SDRAM devices have a highly standardised pin lay-out. FIG. 1 does not give an exact representation of such a pin-layout, but it schematically shows which I/O nodes are generally present on an SDRAM device. The circuit 100 has a data bus D0–D3, an address bus A0–A11, and a control bus including a Chip Select pin (CSn), an Output Enable pin (OEn), Write Enable pin (WEn), Clock pin (CLK), Clock Enable pin (CKE), Row Address Strobe pin (RAS), Column Address Strobe pin (CAS), and Data I/O Mask pins (DQML and DQMH). The precise functions of these pins are not relevant for the invention. However, the standardised pin lay-out obstructs the addition of boundary-scan circuitry because of the required extra pins. Another reason for not using boundary-scan for interconnect testing of devices like circuit 100 is the enormous pressure on cost. As a result, the IC area available for extra features like interconnect testing is very limited. In accordance with the invention, as an alternative to an ordinary boundary-scan test unit, the test unit 120 is operable as a low complexity memory. Such a test unit can be implemented very efficiently in terms of IC area and requires less or even zero extra pins.

A low complexity memory can have a read-only behaviour or a read/write behaviour. In accordance with the invention, a test unit has either kind of behaviour, or both kinds of behaviour in subsequent phases of an interconnect test. In the circuit 100, during a first part of a preferred interconnect test, the test unit 120 has a read-only behaviour and during a subsequent second part of the interconnect test, the test unit 120 has a read/write behaviour. This two-step approach enables a thorough interconnect test that is especially suited for SDRAMs like the circuit 100. The first part of the interconnect test aims at testing the address bus of the circuit 100 and is functionally described by:

1. After power up of the circuit 100, a test mode is active which allows read access to the test unit 120. The test unit 120 is then operable as a ROM table. Alternatively, the test mode is activated by other means, such as a particular combination or sequence of signals applied to the I/O nodes 130, 140 of the circuit 100.
2. Read access to the test unit 120 is controlled by CSn=0, OEn=0 and WEn=1, and validated by a defined edge of the CLK and active level of the clock enable CKE.
3. The test unit's ROM table is addressed by the 'extended' address bus which is defined as the actual address bus, extended with the control signals RAS, CAS, DQML and DQMU.
4. The width of the ROM table is equal to the width of the data bus plus possible additional outputs of the circuit 100.
5. Each of the primary addresses (all but one address bits equal to '0', one address bit equal to '2') reads the all '1' data word. All other extended addresses read the all '0' data word.

The table below shows the contents of the ROM table for the SDRAM device of circuit 100, with 12 bit wide address bus, RAS, CAS, DQML and DQMU and four data pins.

| extended address bus AAAAAAAAAAAARCDD 119876543210AAQQ 10 SSMM LH | data bus DDDD 3210 |
|---|---|
| 000000000000001 | 1111 |
| 000000000000010 | 1111 |
| 000000000000100 | 1111 |
| 000000000001000 | 1111 |
| 000000000010000 | 1111 |
| 000000000100000 | 1111 |
| 000000001000000 | 1111 |
| 000000010000000 | 1111 |
| 000000100000000 | 1111 |
| 000001000000000 | 1111 |
| 000010000000000 | 1111 |
| 000100000000000 | 1111 |
| 001000000000000 | 1111 |
| 010000000000000 | 1111 |
| 100000000000000 | 1111 |
| 'any other address' | 0000 |

With the above described functional behaviour of the circuit 100 after power up, an efficient test for the extended address bits consist of just reading all primary addresses (16 in the above case) and one other address. The test sequence covers the following faults:
1. any stuck-at 1 on an extended address pin
2. any stuck-at 0 on an extended address pin
3. any 2-net AND-type short between any pair of address pins
4. any 2-net OR-type short between any pair of address pins
5. any stuck-at 1 on a data pin
6. any stuck-at 0 on a data pin An interconnect with a stuck-at fault remains at either logic high or logic low, no matter what signals are applied to it. A 2-net AND-type short between a first and a second interconnect causes the two interconnects to carry the same logic value as determined by either one of the interconnects. A 2-net OR-type short between a first and a second interconnect causes the two interconnects to carry complementary logic values as determined by either one of the interconnects.

The above test sequence provides a diagnostic resolution down to a single pin. Note that this test concept is independent from the number of extended address lines or the number of data lines, nor is there any relation assumed between the two numbers.

The second part of the interconnect test aims at testing for shorts between the interconnects making up the data bus, and is functionally described by:
1. Write access is provided to a command register, which is loaded with the value of the (actual) address bus.
2. There will be a certain combination of address bits, which, after being loaded into the aforementioned command register, select a single write/read register that logically forms part of the test unit, with a width equal to the width of the data bus. This combination of address bits is to be determined by the manufacturer of the device and to be specified in the data sheet.

This single write/read register can then be used to write data and read data. Algorithms are available to generate a minimal set of test patterns which cover all AND-type and OR-type shorts between any pair of data lines. The table below shows a set of test patterns for a 16-bit wide data bus.

| DDDDDDDDDDDDDDDD |
|---|
| 1111119876543210 |
| 543210 |
| 1111100000000000 |
| 0000011111100000 |
| 1110011100011000 |
| 1001011010010110 |
| 1100110011001100 |
| 0101010101010101 |

For dynamic memory devices, like the circuit 100, the above described two parts of the interconnect test have read and write access to the test unit which is not affected with any dynamic requirements. It will be clear that many variants can be imagined to either part. Moreover, one can also choose to implement only one of the above described two parts of the interconnect test. For flash devices, for example, the first part of the interconnect test is applicable for unprogrammed devices. The manufacturer may choose not to offer this facility for already programmed devices, to accomplish compatibility with EPROM devices (these access the main memory array when a first read is done after power up).

As mentioned above, the mechanism for switching the circuit from the normal mode into the test mode may be implemented in different ways. In the SDRAM embodiment, the circuit is brought into the test mode by performing a read action after power up. Such a read action after power up, is a special action which does not form part of the normal actions for the circuit and has been given the special meaning of a command for switching into the test mode. In general, any pattern or sequence of patterns applied to one or more I/O nodes of the circuit can be given the special meaning of a command for going into test mode, provided that this pattern or sequence is not used in the normal mode of the circuit. An alternative is to provide the circuit with a dedicated test control node, in addition to the I/O nodes, to control whether the circuit is to behave in the normal operational mode or in the test mode. The actual signal value on the test control node, in relation with predefined values corresponding to the respective modes, brings the circuit into the desired mode.

FIG. 2 shows a way to provide access during interconnect test to a circuit 200 that is testable in accordance with the invention. The circuit 200 includes a test unit 205 that is operable as a low complexity memory. A neighbouring circuit 210, which has boundary-scan circuitry, can provide data to and receive data from the circuit 200 via a control and address bus 220 and a bi-directional data bus 230. Alternatively, when only a ROM behaviour is implemented in the test unit 205, the data bus 230 would be unidirectional, i.e. from the circuit 200 to the circuit 210.

A number of interconnects make up the control and address bus 220 and the data bus 230. The function of these interconnects during a normal mode is irrelevant for the invention. When the circuit 200 is a memory device, there will also be a 'normal mode data bus'. The 'test mode data bus' 230 could partly or completely coincide with the normal mode data bus. The same applies to the control and address bus 220.

Via a boundary-scan chain 240 data is shifted into circuit 210, that data making up read and/or write commands to be supplied to the circuit 200. After a read command, the boundary-scan chain 240 captures data supplied to the data bus 230 by the circuit 200. That data subsequently are shifted out to be analysed externally.

FIG. 3 shows a further way to provide access during interconnect test to a circuit 300 that is testable in accordance with the invention. The circuit 300 includes a test unit 305 that is operable as a low complexity memory via control and address bus 320 and data bus 330. A neighbouring circuit 310, which is a microprocessor, executes the program with the necessary read and write commands. The test program and the test data are stored in a memory 340 of the circuit 310. Preferably, the circuit 310 also analyses the data obtained from the circuit 300. The circuit 310 could alternatively be an ASIC.

The above presented design-for-test method does not require any additional pins to the device for test access, meeting pin count and pin compatibility requirements of this type of memories. Silicon area overhead is limited to the (small) ROM table, or functional equivalent, the read/write data register (possibly to be combined with existing logic) and the associated decoding logic. Standardisation of this approach by a body like EIS or JEDEC would ensure compatibility between devices from different manufacturers.

Boundary-scan is the preferred design-for-test method for testing interconnects on assemblies with ICs. It can be used to efficiently test all interconnects between devices with boundary-scan circuitry implemented. It can also be used directly to apply test patterns for low complexity memory devices. If the above described design-for-test method is implemented in complex memory devices, then also these devices can efficiently be tested using boundary scan access, without restrictions from dynamic requirements, initialisation issues and erasure issues for non-volatile devices. The described interconnect test approach does not need additional test pins, and only requires little silicon area.

FIG. 4 shows an alternative embodiment of the invention. In the same way as described above, the circuit 402 of which the interconnects are to be tested has a main unit 404 and a test unit 406. The main unit 404 is active in the normal operational mode of the circuit and the test unit is active in the test mode of the circuit. The interconnect test in this embodiment is functionally described by:

1. After power-up of the circuit 100, the test mode can be activated, which allows read access to the test unit 120. The test unit 120 is then operable as a ROM table. Alternatively, the test mode is activated by other means, such as activating a particular pin. Alternatively, a particular combination or sequence of signals applied to the I/O nodes 130, 140 of the circuit 100 may activate the test mode.
2. Read access to the test unit 120 is controlled by CSn=0, CASn=0 and CKE=0, followed by CKE=1.
3. The test unit's ROM table function is addressed by the 'extended' address bus which is defined as the actual address bus, extended with the remaining control signal inputs (in case of a typical 64M SDRAM example: A0–A12, RASn, CLK, Wen, DQM0–DQM3).
4. The width of the output table is that of the extended data bus, all pins of the device which are used as output, when in test mode. (In case of a typical 64M SDRAM example: DQ0–DQ31). (In case of a Flash device, Databus including the read/busy pin).
5. During test mode the respective extended data bus extended address bus may be changed.
6. Each of the primary addresses and the all '0' and all '1' input read an implementation defined data word. All other address values read results different from these.

For the purpose of the interconnect test, the pins of circuit 402 are divided into 3 groups: a control bus 408 of p bits wide, an input bus 410 of n bits wide and an output bus 412 of m bits wide. The control bus is used to set the circuit into the test mode. A single line control bus may be used, i.e. one pin whose actual signal value determines whether the circuit is set in the test mode or in the normal operational mode. Or a number of lines may be used, whereby a specific combination of signals applied on the respective pins sets the circuit into the test mode. The remaining input pins of the circuit are grouped into the input bus. The output pins of the circuit and the bi-directional pins of the circuit are grouped into the output bus. As an alternative, one or more of the bi-directional pins can be grouped into the input bus.

The test unit 406 of this embodiment is a combinatorial circuit between the input bus 410 and the output bus 412. This circuit implements the functionality of a ROM table. The design of the combinatorial circuit is based on the following rules:

1. Each output signal is an exclusive-nor function of two or more input signals;
2. There are no two output signals that depend on the same set of input signals;
3. Each input signal contributes to at least one exclusive-nor function forming an output signal.

The example below is a description of the test unit for an input bus of five bits and an output bus of two bits. The description is given in the standard language Verilog.

```
module en5_2 (o1, o2, i1, i2, i3, i4, i5);
    output o1, o2;
    input i1, i2, i3, i4, i5;
    xnor #1 (o1, i1, i2);
    xnor #1 (o2, i3, i4, i5);
endmodule
```

EXAMPLE 1

A Test Unit with Five Inputs and Two Outputs

The first line indicates that a new module starts and specifies the signals of that module. The second and third line indicate the output and input signals respectively. The fourth line defines the relation between the output signal o1 and the input signals i1 and i2 by means of the Verilog primitive xnor, which implements the exclusive-nor function. The '#1' symbol indicates that the output of the xnor primitive is available after 1 cycle of a simulator simulating this module.

FIG. 5 schematically shows the test unit for five inputs and two outputs. This figure corresponds with the example above. The test unit 406 has a two-input XNOR gate 502 which implements the required exclusive-nor function between o1 and i1 and i2. The test unit further has a three-input XNOR gate 504 which implements the exclusive-nor function between the input pins i3, i4 and i5 and the output pin o2.

Another example of the test unit is given below. In this example, the test unit has five inputs and five outputs.

```
module en5_5 (o1, o2, o3, o4, o5, i1, i2, i3, i4, i5);
    output o1, o2, o3, o4, o5;
    input i1, i2, i3, i4, i5;
    xnor #1 (o1, i1, i2);
    xnor #1 (o2, i1, i3);
    xnor #1 (o3, i1, i4);
    xnor #1 (o4, i1, i5);
    xnor #1 (o5, i2, i3);
endmodule
```

EXAMPLE 2

A Test Unit with Five Inputs and Five Outputs

For a given test unit, there must be enough input pins to feed the outputs while adhering to the rules stated above. In the general case of n inputs, a theoretical number of $2^n$ possible combinations of exclusive-nor functions can be obtained. Given the purpose of testing the interconnects however, the n exclusive-nor functions with one input have to be excluded as well as the exclusive-nor function with zero inputs. This means that in order to feed m outputs, the following relation must be met:

$$m < 2^n - n$$

So for example five inputs are enough to feed as many as 26 outputs, while adhering to the rules for implementing the test unit according to this embodiment.

For performing the interconnect test as described above, the patterns that are applied to the inputs are the:
a pattern with all 0s
n patterns with a 'walking' 1
a pattern with all 1s
n patterns with a 'walking' 0
The following table gives the patterns for Example 1 and the required outputs.

| pattern number | iiii 12345 | oo 12 |
|---|---|---|
| 1 | 00000 | 11 |
| 2 | 10000 | 01 |
| 3 | 01000 | 01 |
| 4 | 00100 | 10 |
| 5 | 00010 | 10 |
| 6 | 00001 | 10 |
| 7 | 11111 | 10 |
| 8 | 01111 | 00 |
| 9 | 10111 | 00 |
| 10 | 11011 | 11 |
| 11 | 11101 | 11 |
| 12 | 11110 | 11 |

So a combination of bits given in the second column of the table applied on the input pins of the test unit gives on the output pins a signal as specified in the corresponding element of the third column. The following table gives the input test patterns and the corresponding outputs for Example 2.

| pattern number | iiii 12345 | ooooo 12345 |
|---|---|---|
| 1 | 00000 | 11111 |
| 2 | 10000 | 00001 |
| 3 | 01000 | 01110 |
| 4 | 00100 | 10110 |
| 5 | 00010 | 11011 |
| 6 | 00001 | 11101 |
| 7 | 11111 | 11111 |
| 8 | 01111 | 00001 |
| 9 | 10111 | 01110 |
| 10 | 11011 | 10110 |
| 11 | 11101 | 11011 |
| 12 | 11110 | 11101 |

A third example of the test unit similar to example 1 above, but now implemented with xor primitives is given below.

```
module ex5_2 (o1, o2, i1, i2, i3, i4, i5);
    output o1, o2;
    input i1, i2, i3, i4, i5;
    xor #1 (o1, i1, i2, i3);
    xor #1 (o2, i3, i4, i5);
endmodule
```

EXAMPLE 3

A Test Unit with Five Inputs and Two Outputs using xor Primitives

FIG. 6 schematically shows an alternative for the test unit for five inputs and two outputs. This figure corresponds with the Example 3 above. The test unit 406 has a three-input XOR gate 602 which implements the required exclusive-or function between o1 and i1, i2 and i3. The test unit further has a three-input XOR gate 604 which implements the exclusive-or function between the input pins i3, i4 and i5 and the output pin o2.

The following table gives the patterns for Example 3 together with the required outputs.

| pattern number | iiii 12345 | oo 12 |
|---|---|---|
| 1 | 00000 | 00 |
| 2 | 10000 | 10 |
| 3 | 01000 | 10 |
| 4 | 00100 | 11 |
| 5 | 00010 | 01 |
| 6 | 00001 | 01 |
| 7 | 11111 | 11 |
| 8 | 01111 | 01 |
| 9 | 10111 | 01 |
| 10 | 11011 | 00 |
| 11 | 11101 | 10 |
| 12 | 11110 | 10 |

It is to be noted that the above-mentioned embodiments illustrate rather than limit the invention and that those skilled in the art will be able to design many alternative embodiments without departing from the scope of the appended claims. In the claims, any reference signs placed between parentheses shall not be construed as limiting the claim.

What is claimed is:

1. An electronic circuit comprising:
   a plurality of input/output (I/O) nodes for connecting the electronic circuit to a further electronic circuit via interconnects,
   a main unit for implementing a normal mode function of the electronic circuit,
   and a test unit for testing the interconnects,
   the electronic circuit having a normal mode in which the I/O nodes are logically connected to the main unit and a test mode in which the I/O nodes are logically connected to the test unit,
   wherein the test unit comprises at least one combinatorial circuit implementing at least one of an XNOR function and an XOR function with at least two function inputs and a function output, the function inputs being connected to particular I/O nodes arranged to operate as input nodes of the test circuit and the function output being connected to a particular I/O node arranged to operate as output node of the test circuit.

2. An electronic circuit as recited in claim 1, wherein the test unit comprises a Read Only Memory (ROM).

3. An electronic circuit as recited in claim 1, wherein the test unit comprises a read/write register.

4. An electronic circuit as recited in claim 1, wherein the test unit comprises a combinatorial circuit implementing an XNOR function and being connected to the I/O nodes.

5. An electronic circuit as recited in claim 4, wherein a first selection of the I/O nodes are arranged to carry respective input signals and a second selection of the I/O nodes are arranged to carry respective output signals and wherein the test unit is arranged according to the following rules:
   each output signal results from an XNOR function having at least two input signals,
   each output signal is dependent on a unique subset of the input signals,
   each input signal contributes to at least one output signal via a particular XNOR function.

6. An electronic circuit as recited in claim 1, wherein the test unit comprises a combinatorial circuit implementing an XOR function and connected to the I/O nodes.

7. An electronic circuit as recited in claim 1, wherein the main unit is arranged to bring the electronic circuit into the test mode on receipt via a subset of the I/O nodes of a predefined pattern or sequence of patterns.

8. An electronic circuit as recited in claim 1, wherein the electronic circuit is provided with a test control node and wherein the electronic circuit is arranged to switch into the test mode on the basis of a signal value on the test control node.

9. An electronic circuit as recited in claim 1, wherein the main unit is a Synchronous Dynamic Random Access Memory (SDRAM) and the test mode is activatable by a read action following power up of the electronic circuit.

* * * * *